United States Patent
Paik

(10) Patent No.: US 7,253,036 B2
(45) Date of Patent: Aug. 7, 2007

(54) METHOD OF FORMING GATE INSULATION FILM USING PLASMA METHOD OF FABRICATING POLY-SILICON THIN FILM TRANSISTOR USING THE SAME

(76) Inventor: Woon Suh Paik, 577-1 1-dong, Sangnok-gu, Ansan-si, Gyeonggi-do (KR)

( * ) Notice: Subject to any disclaimer, the term of this patent is extended or adjusted under 35 U.S.C. 154(b) by 273 days.

(21) Appl. No.: 11/119,774

(22) Filed: May 3, 2005

(65) Prior Publication Data

US 2005/0250286 A1    Nov. 10, 2005

(30) Foreign Application Priority Data

May 4, 2004    (KR)    ............ 10-2004-0031426

(51) Int. Cl.
*H01L 21/00* (2006.01)

(52) U.S. Cl. ............ 438/149; 438/150; 257/E21.278; 257/E29.151

(58) Field of Classification Search ............ 438/149, 438/150; 257/E21.278, E27.1, E29.151, 257/E51.005
See application file for complete search history.

(56) References Cited

U.S. PATENT DOCUMENTS

| | | | |
|---|---|---|---|
| 6,677,222 B1 * | 1/2004 | Mishima et al. | 438/488 |
| 7,135,741 B1 * | 11/2006 | Yamazaki et al. | 257/347 |
| 2002/0113034 A1 * | 8/2002 | Moon et al. | 216/2 |
| 2002/0113264 A1 * | 8/2002 | Horikoshi et al. | 257/347 |
| 2002/0119607 A1 * | 8/2002 | Miyasaka et al. | 438/151 |
| 2006/0183276 A1 * | 8/2006 | Yamazaki et al. | 438/166 |
| 2006/0236920 A1 * | 10/2006 | Yamazaki et al. | 117/85 |
| 2006/0255354 A1 * | 11/2006 | Arao et al. | 257/98 |

* cited by examiner

*Primary Examiner*—Thao P. Le
(74) *Attorney, Agent, or Firm*—Rosenberg, Klein & Lee

(57) ABSTRACT

A method of forming a gate insulation film of a crystallized thin film transistor, is provided, which can enhance an interfacial feature which exists between a gate oxide film and a silicon thin film substrate and which is fatal to performance of the thin film transistor, in the case that crystallization of amorphous silicon is performed by metal induced lateral crystallization (MILC). The gate insulation film formation method includes the steps of: forming an amorphous silicon film on an insulation substrate, and then patterning the amorphous silicon film, to thereby form a semiconductor layer; processing the semiconductor layer made of the amorphous silicon film by an oxygen plasma method, and oxidizing the silicon surface, to thereby form a first silicon oxide film; and mixing gas with silicon and depositing a second silicon oxide film on the first silicon oxide film by a PECVD (Plasma Enhanced Chemical Vapor Deposition) method.

12 Claims, 4 Drawing Sheets

METHOD OF FORMING GATE INSULATION FILM USING PLASMA METHOD OF FABRICATING POLY-SILICON THIN FILM TRANSISTOR USING THE SAME

This application claims the benefit of Korea Patent Application No. 10-2004-0031426, filed May 4, 2004, the contents of which are hereby incorporated herein by reference in their entirety.

BACKGROUND OF THE INVENTION

1. Field of the Invention

The present invention relates to a method of forming a gate insulation film using plasma, and more particularly, to a method of forming a gate insulation film using plasma, and a method of fabricating a poly-silicon thin film transistor using the same, which can enhance an interfacial feature which exists between the gate insulation film and a silicon thin film and which is fatal to performance of the thin film transistor.

2. Description of the Related Art

In general, a silicon nitride film or a silicon oxide film as a gate insulation film is deposited on a silicon thin film by a PECVD (Plasma Enhanced Vapor Deposition) method when a thin film transistor is fabricated. In the case of an amorphous silicon thin film transistor, crystallization of a silicon thin film does not vary by the following processes. In the case of a laser or high-temperature poly-silicon thin film transistor, an amorphous silicon thin film is poly-crystallized in advance prior to depositing a gate insulation film. Accordingly, there is no physical/chemical change on an interfacial surface between the gate insulation film and the silicon thin film after having formed the gate insulation film.

However, an amorphous thin film transistor is worked by a metal induced lateral crystallization (MILC) method to thus form a poly-crystallization thin film transistor. Thereafter, a change in volume of a silicon thin film occurs at a crystallization process of crystallizing an amorphous silicon thin film. Thus, a physical/chemical change is induced on the interfacial surface between the gate insulation film and the silicon thin film which have been formed before.

A conventional method of fabricating a poly-crystallization thin film transistor using a MILC method will follow.

FIGS. 1A through 1D are cross-sectional views for explaining a conventional low-temperature poly-silicon thin film transistor fabrication method using a MILC method, respectively.

Referring to FIG. 1A, a buffer layer 10 made of an oxide film is formed on an insulation substrate such as a glass substrate (not shown), and then an amorphous silicon film is formed on the buffer layer 10. Then, the amorphous silicon film is patterned by a photographic etching process to thereby form a semiconductor layer 11, and subsequently, an insulation film and a metal film are deposited on a substrate by a PECVD (Plasma Enhanced Vapor Deposition) method and a sputtering method, respectively, and then patterned by the photographic etching process, to thereby form a gate electrode 13 and a gate insulation film 12.

Then, referring to FIG. 1B, a source region 11S and a drain region 11D are formed through an ion injection process of injecting impurities. Then, as shown in FIG. 1C, an off-set structure is formed using a photosensitive agent pattern 14. Then, a nickel (Ni) film 15 is deposited on the entire substrate surface with crystallization expediting metal for performing metal induced lateral crystallization (MILC).

Referring to FIG. 1D, the photosensitive agent pattern 14 is removed by using a lift-off method, and then a heat treatment is performed at a temperature between 400° C. through 600° C. Accordingly, in the case of a source and drain regions 11S and 11D which contact a nickel (Ni) film 15, amorphous silicon is crystallized into poly-silicon by metal induced crystallization (MIC), while in the case of portions which do not contact the Ni film 15, that is, in the case of exposed off-set regions 16a and 16b and a channel region 11C, amorphous silicon is crystallized into poly-silicon by metal induced lateral crystallization (MILC).

As described above, in the case of a conventional thin film transistor fabrication method of transforming amorphous silicon into poly-silicon using the MILC method, crystallization of amorphous silicon is performed after forming the gate insulation film 12. Thus, a physical/chemical change is induced on an interfacial surface between the gate insulation film and the silicon thin film at the time of crystallization due to a change in volume of silicon.

That is, in the case that an oxide film is directly deposited on amorphous silicon as an insulation film, a dangling bond of silicon which is not completely oxidized and bonded on a silicon/oxide film interfacial surface may exist. This functions as a trap for capturing a carrier passing through a transistor channel to thereby deteriorate features of a device, in particular, deteriorate a junction capability between an upper oxide film and a silicon film at the time of crystallizing amorphous silicon.

A physical/chemical change occurring on the interfacial surface makes a big influence upon electrical characteristics of a transistor such as a leakage current, an electron mobility, and an on/off ratio. Thus, a new process need to be developed in order to minimize a bad influence affecting on electrical characteristics of a transistor by the physical/chemical change.

SUMMARY OF THE INVENTION

To solve the above problems, it is an object of the present invention to provide a method of forming a gate insulation film using plasma, which can minimize an influence of a physical/chemical change on an interfacial surface which exists between a gate insulation film and a silicon thin film and which occurs when an amorphous silicon thin film is crystallized after having formed an amorphous thin film transistor.

It is another object of the present invention to provide a method of fabricating a poly-silicon thin film transistor which can prevent electrical characteristics such as leakage current and electron mobility of the poly-silicon thin film transistor from deteriorating by using a method of forming a gate insulation film using plasma.

To accomplish the above object of the present invention, there is provided a method of forming a gate insulation film in a poly-silicon thin film transistor, the gate insulation film formation method comprising the steps of: forming an amorphous silicon film on an insulation substrate; patterning the amorphous silicon film, to thereby form a semiconductor layer; processing the semiconductor layer made of the amorphous silicon film by an oxygen plasma method, and oxidizing the silicon surface, to thereby form a first silicon oxide film; and mixing gas with silicon and depositing a second silicon oxide film on the first silicon oxide film by a PECVD (Plasma Enhanced Chemical Vapor Deposition) method.

In this case, the first silicon oxide film is formed by processing the semiconductor layer by an oxygen plasma method under the atmosphere of gas such as $N_2O$ and Ar. At the state where vacuum is not broken, gas such as $SiH_4$, $N_2O$ and Ar is introduced in order to deposit the second silicon oxide film on the first silicon oxide film, in which an ECR (Electro Cyclotron Resonance)-CVD apparatus or a PECVD apparatus is used.

A processing gas used for the oxygen plasma processing may be any one selected from the group consisting of mixture gas of $N_2O$ and Ar, mixture gas of $O_2$ and Ar, and gas of $O_2$, and gas of $N_2O$.

Also, the first silicon oxide film is formed by the oxygen plasma processing for 5~30 minutes, preferably, 10~20 minutes at a power of 100~200 W.

Further, the gate insulation film formation method according to the present invention further comprises the step of executing an oxygen plasma processing in order to oxidize the surface of the second silicon oxide film.

In the case of fabricating a MILC poly-silicon thin film transistor using a gate insulation film formation method according to the present invention, an influence of a physical/chemical change on an interfacial surface between the gate insulation film and the silicon thin film is minimized to thereby enhance an interfacial feature.

BRIEF DESCRIPTION OF THE DRAWINGS

The above and other objects and advantages of the present invention will become more apparent by describing the preferred embodiments thereof in detail with reference to the accompanying drawings in which.

DETAILED DESCRIPTION OF THE INVENTION

A preferred embodiment of the present invention will be described with reference to the accompanying drawings.

Referring to FIGS. 2A through 2G, a method of fabricating a thin film transistor using a plasma method according to an embodiment of the present invention will be described below.

Figure 1A:
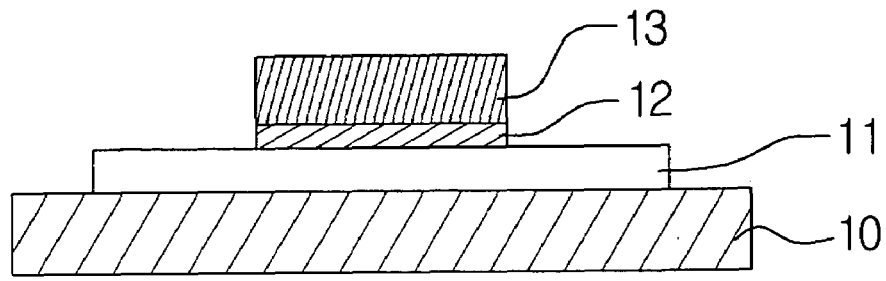
FIGS. 1A through 1D are cross-sectional views for explaining a conventional method of fabricating a crystallized thin film transistor using a conventional MILC method.
Figure 1B:
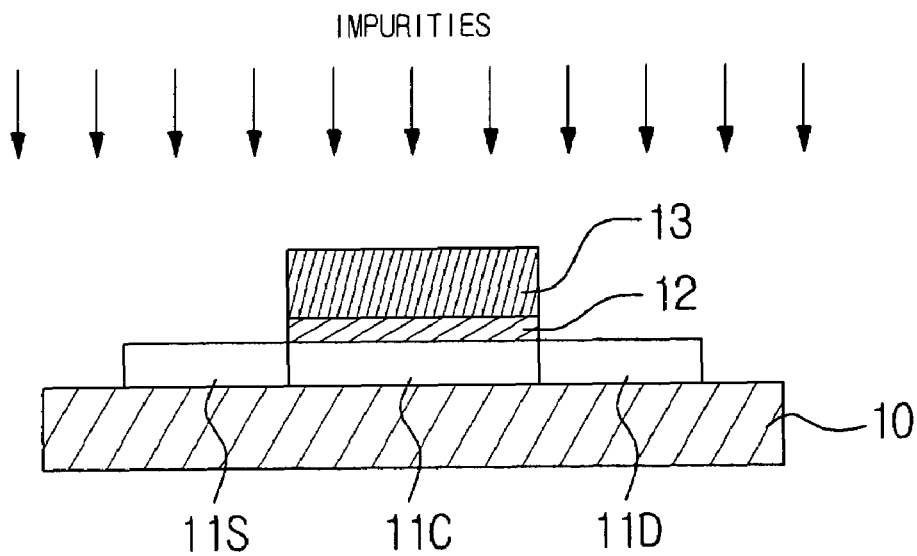
Figure 1C:
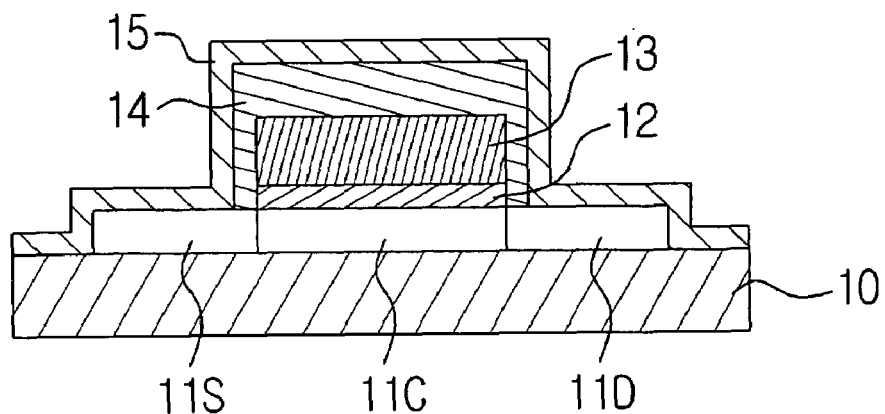
Figure 1D:
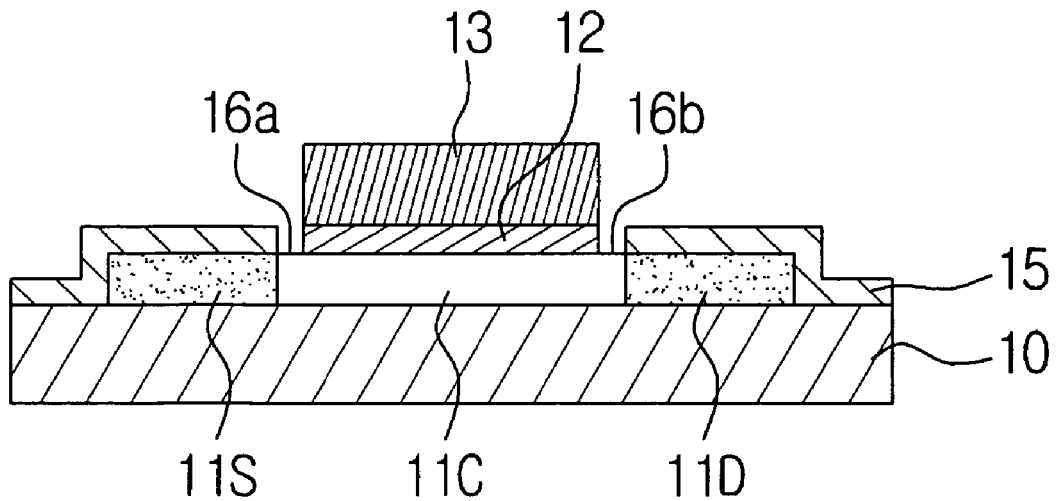
Figure 2A:
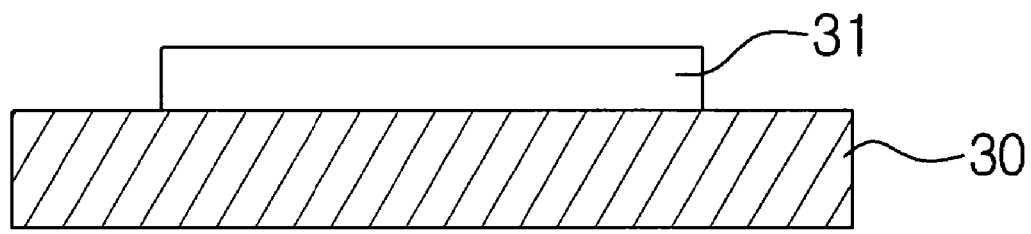
FIGS. 2A through 2G are cross-sectional views for explaining a method of fabricating a poly-silicon thin film transistor using a plasma method according to an embodiment of the present invention.

First, referring to FIG. 2A, an amorphous silicon film is formed on an insulation substrate 30, and the amorphous silicon film is patterned, to thereby form a semiconductor layer 31 made of an amorphous silicon film.

Figure 2B:
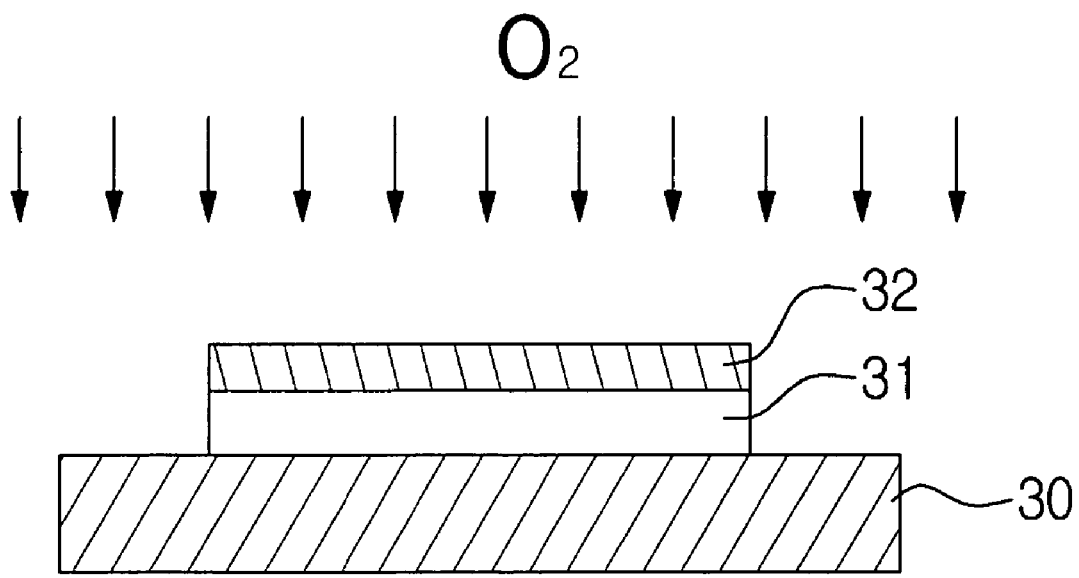

Then, as shown in FIG. 2B, the insulation substrate 30 including the semiconductor layer 31 made of the amorphous silicon film is exposed to oxygen plasma to thus oxidize the silicon surface and form a fist silicon oxide film 32. That is, the plasma processing of the amorphous silicon is executed by the following steps of loading a substrate into an ECR (Electro Cyclotron Resonance)-CVD or PECVD (Plasma Enhanced Chemical Vapor Deposition) apparatus, introducing gas of $N_2O$ and Ar simultaneously, and applying power to thus create plasma. In this case, $N_2O$ plays a role of supplying oxygen elements necessary for oxidation and Ar plays a role of maintaining plasma and transferring physical energy to a silicon surface.

Here, the applied power is 100~200 W, and the processing time is 5~30 minutes, preferably, 10~20 minutes. The thickness of the first silicon oxide film 32 is determined according to time exposed to plasma and is 10~200 Å. It is preferable that the thickness of the first silicon oxide film 32 is 10~100 Å. At the processing condition, the first silicon oxide film 32 is saturated at the thickness of about 200 Å. That is, although the plasma-exposure time prolongs, the thickness of the silicon oxide film does not increase.

Also, other than mixture gas of $N_2O$ and Ar which is used for the oxygen plasma processing, pure gas of $O_2$ and Ar is mixed to then be used for plasma processing. Otherwise, pure gas of only $O_2$ or only $N_2O$ is introduced to then be used for plasma processing.

Figure 2C:
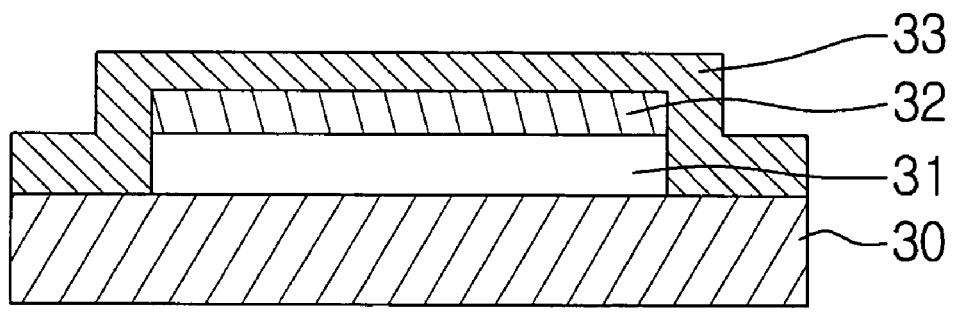

Then, gas including silicon is mixed as shown in FIG. 2C. Then, as shown in FIG. 2C, a gate insulation film 33 of additionally desired thickness is formed by a PECVD (Plasma Enhanced Chemical Deposition) method. That is, at the state where vacuum is not broken in a PECVD apparatus, gas such as $SiH_4$, $N_2O$ and Ar is introduced in order to deposit a second silicon oxide film 33 on the first silicon oxide film 32 which has been formed by the oxygen plasma processing. In this case, thickness of the second silicon oxide film 33 is 500~2,000 Å, preferably, 600~1,000 Å.

Further, after having completed the deposition of the second silicon oxide film 33 by the PECVD method, gas of only $N_2O$ or Ar is introduced again. Accordingly, a plasma processing can be executed at the same processing condition as that of the oxygen plasma processing of FIG. 2B.

However, since the surface is not silicon but an oxide film in this case, oxidation by plasma is not active in comparison with the case of silicon, the plasma processing is executed for 1~10 minutes, preferably, for 5~10 minutes. The additional processing perfectly oxidizes the surface of the second silicon oxide film 33 deposited by the PECVD method and further enhances an interfacial feature between a gate electrode and a gate insulation film which are deposited later.

If an oxygen plasma processing is executed before depositing an oxide film as described above, most of silicon bonds existing on the surface of the amorphous silicon film are oxidized using oxygen plasma having a good reactivity, and then a homogeneous oxide film is deposited again thereon. As a result, a trap site can be reduced and a junction capability of a film can be enhanced.

Figure 2D:
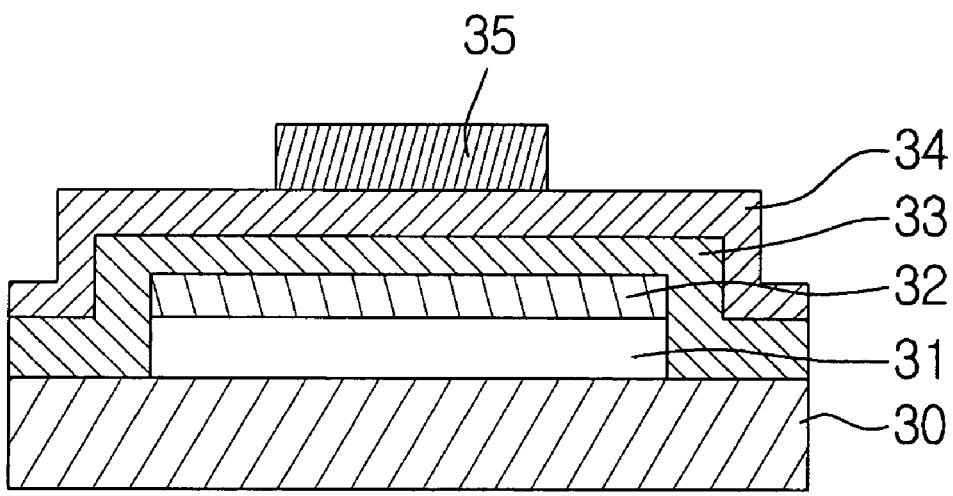
Figure 2E:
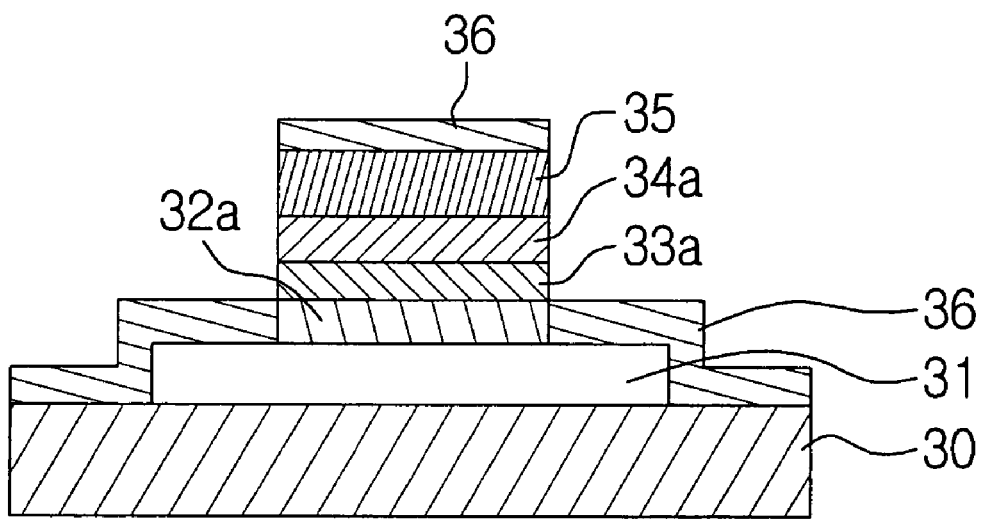

Thereafter, a metal film 34 for a gate electrode is formed by a sputtering method as shown in FIG. 2D. Then, a photosensitivity film mask pattern 35 is formed using photoresist as a mask pattern in order to pattern a gate electrode. As shown in FIG. 2E, the gate electrode metal film 34 and the first and second silicon oxide films 32 and 33 are patterned using the photosensitive film mask pattern 35, to thereby form a gate electrode 34a and gate insulation films 32a and 33a.

Thereafter, at the state where the photosensitivity mask pattern 35 is not removed from the insulation substrate 30 including the semiconductor layer 31, a crystallization expediting metal film 36 is deposited with a thickness of 1~10,000 Å, preferably, 10~200 Å, on the insulation substrate 30 including the semiconductor layer 31, by any one of sputtering, evaporation by heating, PECVD, and a solution coating. Here, as the applicable material of the metal film 36 is any one selected from the group consisting of Ni, Pd, Ti, Ag, Au, Al, Sn, Sb, Cu, Co, Cr, Mo, Tr, Ru, Rh, Cd, and Pt.

Figure 2F:
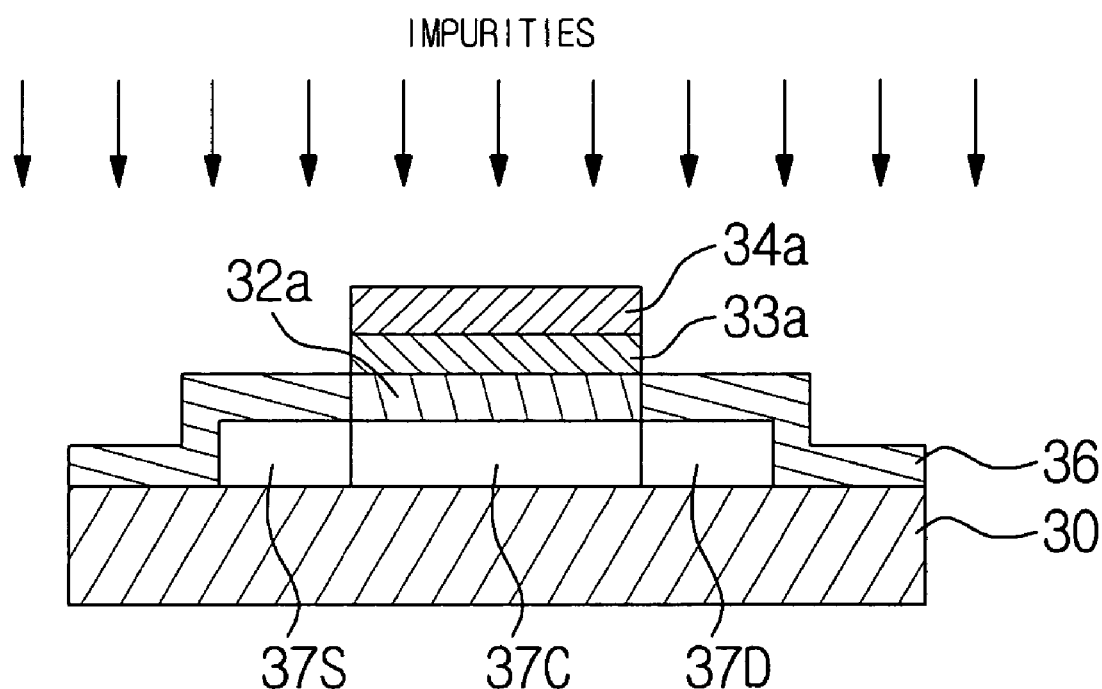

Then, as shown in FIG. 2F, the photosensitive film mask pattern 35 is removed from the insulation substrate 30 by a lift-off method, and high-concentration impurities are ion-injected over the entire surface, to thereby define a source region 37S and a drain region 37D.

Figure 2G:
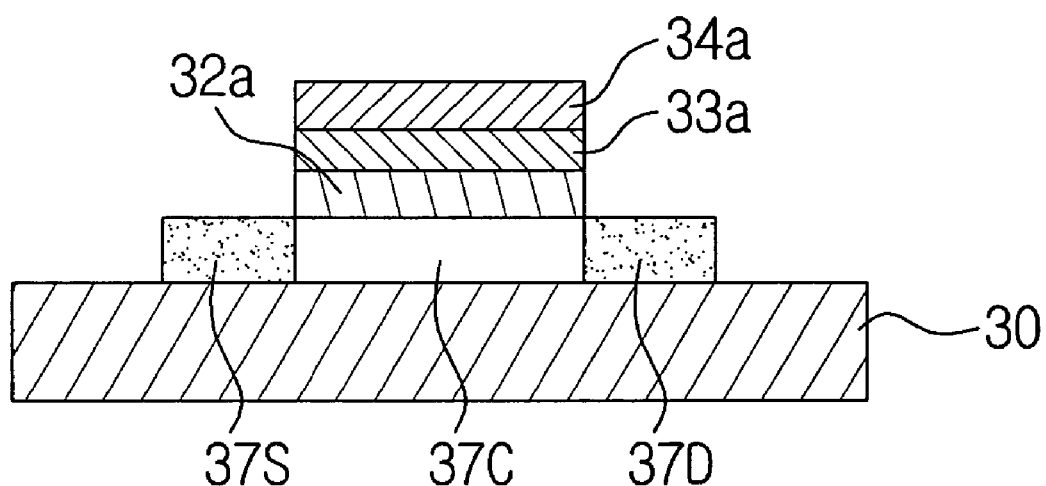

Finally, referring to FIG. 2G, the substrate is heat-treated at a temperature of 400 through 600° C., to thereby execute a crystallization process in order to crystallize an amorphous silicon film into a poly-silicon film. As a result, source and drain regions 37S and 37D contacting the metal film 36 among the semiconductor layer 31 made of the amorphous silicon film is crystallized by a MIC (Metal Induced Crystallization) method and is crystallized into a poly-silicon film. Meanwhile, an amorphous silicon film portion which does not contact the metal film 36, that is, a channel region 37C located below the gate insulation films 32a and 33a are crystallized by a MILC method and crystallized into a poly-silicon film. Thereafter, the remaining metal film 36 is removed.

As described above, a thin film transistor fabrication method according to an embodiment of the present invention forms a gate insulation film not by depositing a gate insulation film directly by a PECVD method but by oxidizing a silicon surface primarily by oxygen plasma and then forming an oxide film by a PECVD secondarily. Therefore, deterioration of an interfacial surface between a silicon film and a gate insulation film occurring at the time of crystallizing an amorphous silicon film can be prevented.

As described above, in the case of a thin film transistor fabrication method according to the present invention, an amorphous silicon thin film is deposited and then the surface of the amorphous silicon thin film is oxidized using oxygen plasma before depositing a gate insulation film by a PECVD method. Accordingly, deterioration of an interfacial surface between the silicon and gate oxide film occurring at the time of crystallizing the amorphous silicon into poly-silicon can be minimized. Thus, deterioration of electrical characteristics such as leakage current and electron mobility of the poly-silicon thin film transistor can be prevented.

As described above, the preferable embodiment of the present invention has been described with reference to the accompanying drawings. However, the present invention is not limited to the above-described embodiment. It is apparent to one who has an ordinary skill in the art that there may be many modifications and variations within the same technical spirit of the invention.

What is claimed is:

1. A method of forming a gate insulation film in a poly-silicon thin film transistor, the gate insulation film formation method comprising the steps of:
   forming an amorphous silicon film on an insulation substrate;
   patterning the amorphous silicon film, to thereby form a semiconductor layer;
   processing the semiconductor layer made of the amorphous silicon film by an oxygen plasma method, and oxidizing the silicon surface, to thereby form a first silicon oxide film; and
   mixing gas with silicon and depositing a second silicon oxide film on the first silicon oxide film by a PECVD (Plasma Enhanced Chemical Vapor Deposition) method.

2. The gate insulation film formation method according to claim 1, wherein the first silicon oxide film is formed by processing the semiconductor layer by an oxygen plasma method under the atmosphere of gas such as $N_2O$ and Ar, and wherein at the state where vacuum is not broken, gas such as $SiH_4$, $N_2O$ and Ar is introduced in order to deposit the second silicon oxide film on the first silicon oxide film.

3. The gate insulation film formation method according to claim 1, wherein a processing gas used for the oxygen plasma processing may be any one selected from the group consisting of mixture gas of $N_2O$ and Ar, mixture gas of $O_2$ and Ar, and gas of $O_2$, and gas of $N_2O$.

4. The gate insulation film formation method according to claim 1, wherein the first and second silicon oxide films are formed by an ECR (Electro Cyclotron Resonance)-CVD apparatus or a PECVD apparatus.

5. The gate insulation film formation method according to claim 1, wherein the first silicon oxide film is formed by the oxygen plasma processing for 5~30 minutes, preferably, 10~20 minutes at a power of 100~200 W.

6. The gate insulation film formation method according to claim 1, wherein thickness of the first silicon oxide film is 10~200 Å, preferably, 10~100 Å, and thickness of the second silicon oxide film is 500~2,000 Å, preferably, 600~1,000 Å.

7. The gate insulation film formation method according to claim 1, further comprising the step of executing an oxygen plasma processing in order to oxidize the surface of the second silicon oxide film.

8. A method of fabricating a poly-silicon thin film transistor, the poly-silicon fabrication method comprising the steps of:
   forming an amorphous silicon film on an insulation substrate;
   patterning the amorphous silicon film, to thereby form a semiconductor layer;
   processing the semiconductor layer made of the amorphous silicon film by an oxygen plasma method, and oxidizing the silicon surface, to thereby form a first silicon oxide film;
   mixing gas with silicon and depositing a second silicon oxide film on the first silicon oxide film by a PECVD (Plasma Enhanced Chemical Vapor Deposition) method;
   forming a metal film for forming a gate electrode on an insulation substrate including the semiconductor layer;
   sequentially patterning the gate electrode forming metal film, the second silicon oxide film and the first silicon oxide film, to thereby form a gate electrode and a gate insulation film;
   ion-injecting impurities onto the substrate to thereby define a source region and a drain region; and
   crystallizing the amorphous silicon in the semiconductor layer into poly-silicon through heat treatment of a MIC (Metal Induced Crystallization) method and a MILC (Metal Induced Lateral Crystallization) method using a crystallization expediting metal film.

9. The poly-silicon thin film transistor fabrication method according to claim 8, wherein the first silicon oxide film is formed by processing the semiconductor layer by an oxygen plasma method under the atmosphere of gas such as $N_2O$ and Ar, and wherein at the state where vacuum is not broken, gas such as $SiH_4$, $N_2O$ and Ar is introduced in order to deposit the second silicon oxide film on the first silicon oxide film.

10. The poly-silicon thin film transistor fabrication method according to claim 8, wherein a processing gas used for the oxygen plasma processing may be any one selected from the group consisting of mixture gas of $N_2O$ and Ar, mixture gas of $O_2$ and Ar, and gas of $O_2$, and gas of $N_2O$.

11. The poly-silicon thin film transistor fabrication method according to claim 8, wherein the first and second silicon oxide films are formed by an ECR (Electro Cyclotron Resonance)-CVD apparatus or a PECVD apparatus.

12. The poly-silicon thin film transistor fabrication method according to claim 8, further comprising the step of executing an oxygen plasma processing in order to oxidize the surface of the second silicon oxide film.

* * * * *